(12) United States Patent
Masleid

(10) Patent No.: US 7,051,294 B2
(45) Date of Patent: May 23, 2006

(54) COLD CLOCK POWER REDUCTION

(75) Inventor: Robert P Masleid, Monte Soreno, CA (US)

(73) Assignee: Fujitsu Limited, Kawasaki (JP)

( * ) Notice: Subject to any disclaimer, the term of this patent is extended or adjusted under 35 U.S.C. 154(b) by 152 days.

(21) Appl. No.: 10/703,295

(22) Filed: Nov. 6, 2003

(65) Prior Publication Data

US 2004/0098630 A1 May 20, 2004

Related U.S. Application Data

(62) Division of application No. 10/040,577, filed on Dec. 28, 2001, now Pat. No. 6,668,357.

(60) Provisional application No. 60/301,890, filed on Jun. 29, 2001.

(51) Int. Cl.
    *G06F 17/50* (2006.01)
(52) U.S. Cl. ............................................. 716/1; 716/4
(58) Field of Classification Search ................ 716/1–6; 326/93
    See application file for complete search history.

(56) References Cited

U.S. PATENT DOCUMENTS

| 5,610,548 | A | | 3/1997 | Masleid |
| 5,614,845 | A | | 3/1997 | Masleid |
| 5,646,572 | A | | 7/1997 | Masleid |
| 5,656,963 | A | | 8/1997 | Masleid et al. |
| 5,675,273 | A | | 10/1997 | Masleid |
| 5,831,451 | A | * | 11/1998 | Bosshart ....................... 326/93 |
| 5,864,487 | A | * | 1/1999 | Merryman et al. ............. 716/6 |
| 5,894,419 | A | | 4/1999 | Galambos et al. |
| 5,926,050 | A | | 7/1999 | Proebsting |
| 5,956,256 | A | * | 9/1999 | Rezek et al. ................... 716/3 |
| 6,025,738 | A | | 2/2000 | Masleid |
| 6,118,304 | A | * | 9/2000 | Potter et al. .................. 326/93 |
| 6,323,706 | B1 | | 11/2001 | Stark et al. |
| 6,366,115 | B1 | | 4/2002 | DiTommaso |
| 6,426,652 | B1 | | 7/2002 | Greenhill et al. |
| 6,466,063 | B1 | | 10/2002 | Chen |
| 6,594,806 | B1 | * | 7/2003 | Casavant ....................... 716/6 |
| 2003/0011413 | A1 | | 1/2003 | Masleid |

* cited by examiner

OTHER PUBLICATIONS

Stojanovic, V. and Oklobdzija, V. "Comparative Analysis of Master-Slave Latches and Flip-Flops for High-Performance and Low-Power Systems", IEEE Journal of Solid-State Circuits, vol. 34, No. 4, Apr. 1999, pp. 536-548.

*Primary Examiner*—Vuthe Siek
*Assistant Examiner*—Binh Tat
(74) *Attorney, Agent, or Firm*—Fenwick & West

(57) ABSTRACT

A multi-mode latch timing circuit has a first set of latches and a second set of latches in each logical path. In a first mode of operation, first and second phase clock signals are provided so that the latch timing circuit functions as a two-phase non-overlapping transparent latch timing circuit. In a second mode of operation, the first set of latches is held in a transparent state in some or all of the logical paths, thereby reducing clock power. In one embodiment, the first set of latches in each long path is held in a transparent state while the second phase clock signal is supplied to the second set of latches. In one embodiment, the first set of latches in each short path is held in a transparent state while a second phase clock signal comprised of shortened duty cycle pulses is supplied to the second set of latches.

12 Claims, 14 Drawing Sheets

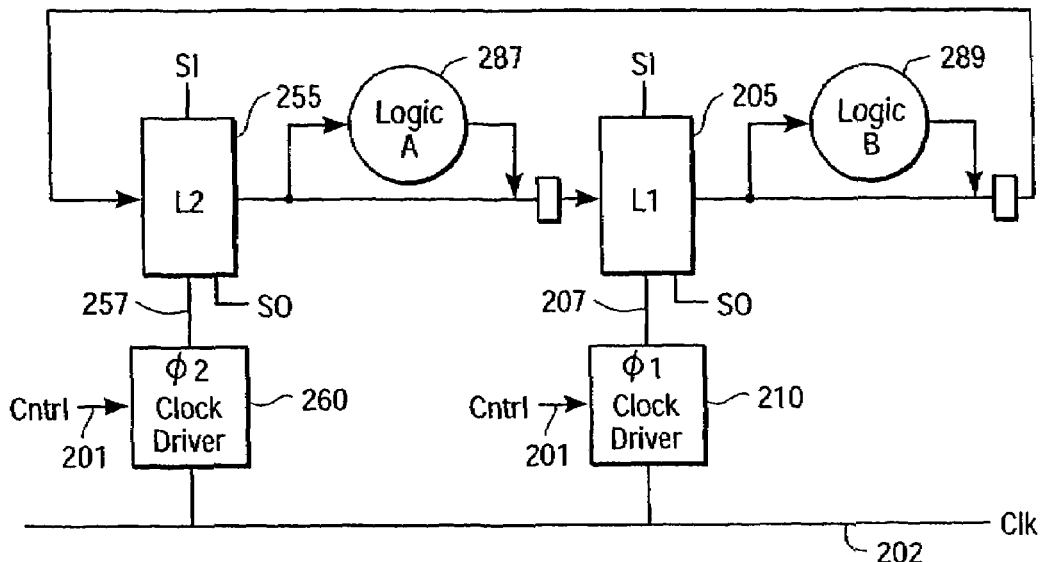

FIG. 2C

| 292 |
|---|
| In a first mode of operation of a logical path, have a first phase clock driver and a second phase clock driver generate nonoverlapping clock signals to clock their corresponding latches as a two-phase latch timing circuit. |

↓

| 294 |
|---|
| In a second mode of operation of a logical path, have the first phase clock driver generate a bias voltage to render its corresponding latches transparent and have the second phase clock driver generate a clock signal to clock its corresponding latches with the pulse width selected to be sufficiently low to prevent a race condition. |

↓

| 296 |
|---|
| In a third mode of operation of a logical path, have the first and second clock drivers generate underlapped first and second phase clock signals to debug race conditions. |

FIG. 2D

COLD CLOCK POWER REDUCTION

RELATED APPLICATIONS

This application is a divisional of U.S. patent application Ser. No. 10/040,577, by Robert Masleid, which was filed on Dec. 28, 2001 now U.S. Pat. No. 6,668,357 and claims priority under 35 U.S.C.§ 119(e) to U.S. patent application Ser. No.: 60/301,890, "Cold Clock Power Reduction," by Robert Masleid, which was filed Jun. 29, 2001, the entire contents of which are hereby incorporated by reference in the present patent application.

BACKGROUND OF THE INVENTION

1. Field of the Invention

The present invention is generally related to latch timing circuits for integrated circuits.

2. Description of Background Art

Transparent latch timing circuits are commonly used in integrated circuits to regulate the flow of logical data signals in each logical path. Referring to FIG. 1, a common latch timing design is a two-phase non-overlapping latch timing circuit 100. During a first portion of the clock cycle, the L1 latch(es) are transparent, allowing a data input to enter the latch, such as into a logic unit 130. During the first clock phase, the L2 latch(es) are closed. During a second portion of the clock cycle, the L1 latches close and the L2 latches become transparent. The sequence of non-overlapping clock phases has several advantages. One benefit is that it prevents a race condition from occurring in outputs fed back through a second logic path 150. This makes the two-phase non-overlapping latch timing circuit robust to design shortcomings and insensitive to manufacturing factors that affect the timing of logical signals in an integrated circuit. Additionally, a two-phase non-overlapping latch timing circuit facilitates testing and debugging using a scan chain and/or other evaluation techniques.

A drawback of the conventional two-phase latch timing circuit 100 is that it consumes more clock power than desired. Some studies indicate that the clock power in a high performance microprocessor can be as high as 70% of total chip power consumption, although 30%–40% is a more typical range for a microprocessor utilizing a conventional two-phase latch timing architecture.

What is desired is a latch timing circuit that has the desirable benefits of a two-phase latch timing circuit but which also permits a reduction in clock power consumption.

SUMMARY OF THE INVENTION

A multimode latch timing circuit is disclosed having at least two modes of operation. The latch timing circuit has two sets of timing latches for controlling the flow of data in a logical path. In one mode of operation, the latch timing circuit operates as a two-phase transparent latch timing circuit with the first set of latches being driven by a first phase clock signal and the second set of latches being driven by a second phase clock signal. In a reduced clock power mode of operation, the first set of latches may be held in a transparent state with a constant bias voltage, reducing clock power consumption by up to half. In long paths, the first set of latches may be held in a transparent state with the second set of latches driven by the second phase clock signal. In short paths, the first set of latches may be held in a transparent state with the second set of latches driven by a second phase clock signal comprising short duty cycle pulses with a pulse width selected to prevent a race condition. The first mode of operation may be used during testing and bring up of an integrated circuit incorporating the latch timing circuit. If the timing delays of the integrated circuit permit operation in the reduced clock power mode of operation, the integrated circuit may be programmed to operate in the reduced clock power mode in one or more logical paths.

In one embodiment, the first set of latches is coupled to a first clock driver and the second set of latches is coupled to a second clock driver. In one embodiment, each clock driver comprises a buffer circuit acting responsive to the output of a logical circuit receiving the master clock signal and at least one control signal.

DESCRIPTION OF THE DRAWINGS

FIG. 2C is a block diagram of a latch timing circuit in accord with the present invention.

FIG. 2D is a flow chart illustrating different modes of operation for the circuits of FIGS. 2A–2C.

DETAILED DESCRIPTION OF THE PREFERRED EMBODIMENTS

Figure 1:
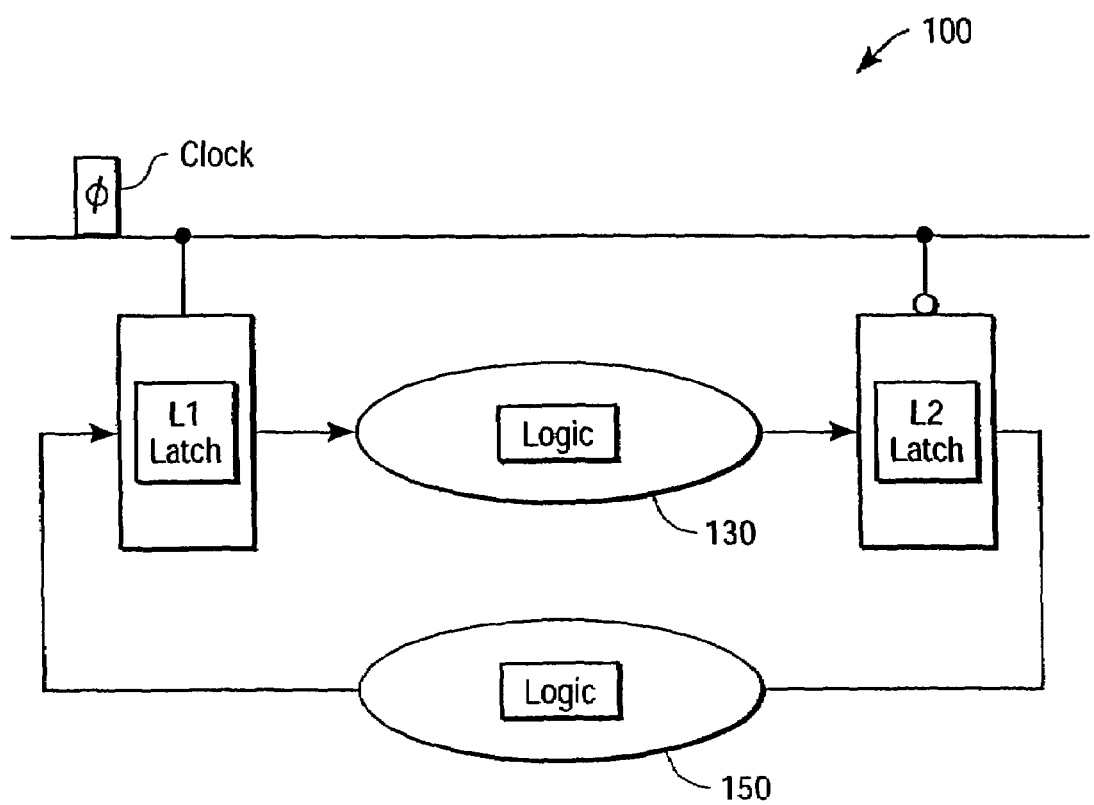
FIG. 1 is a block diagram of a prior art two-phase latch timing circuit.
Figure 2A:
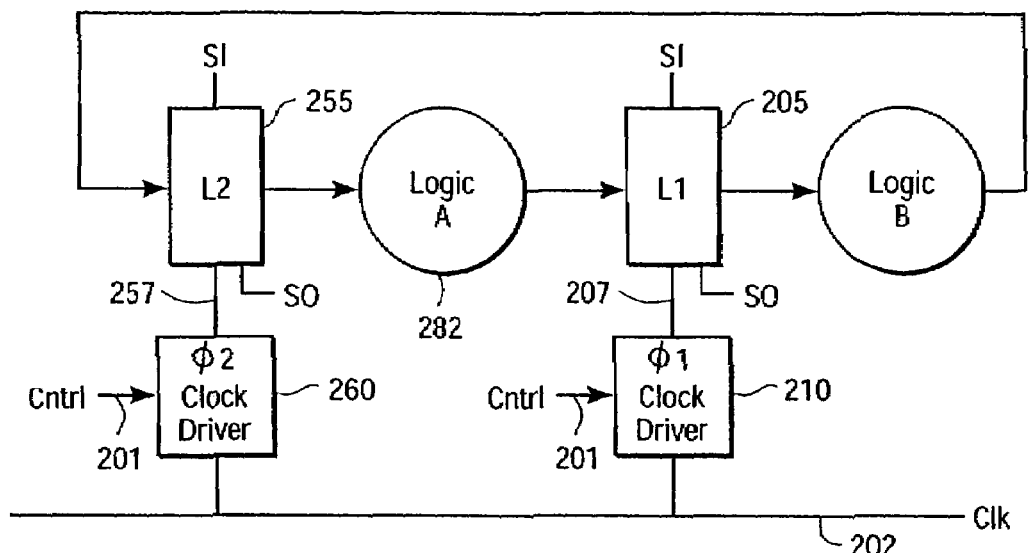
FIG. 2A is a block diagram of a latch timing circuit in accord with the present invention.
Figure 2B:
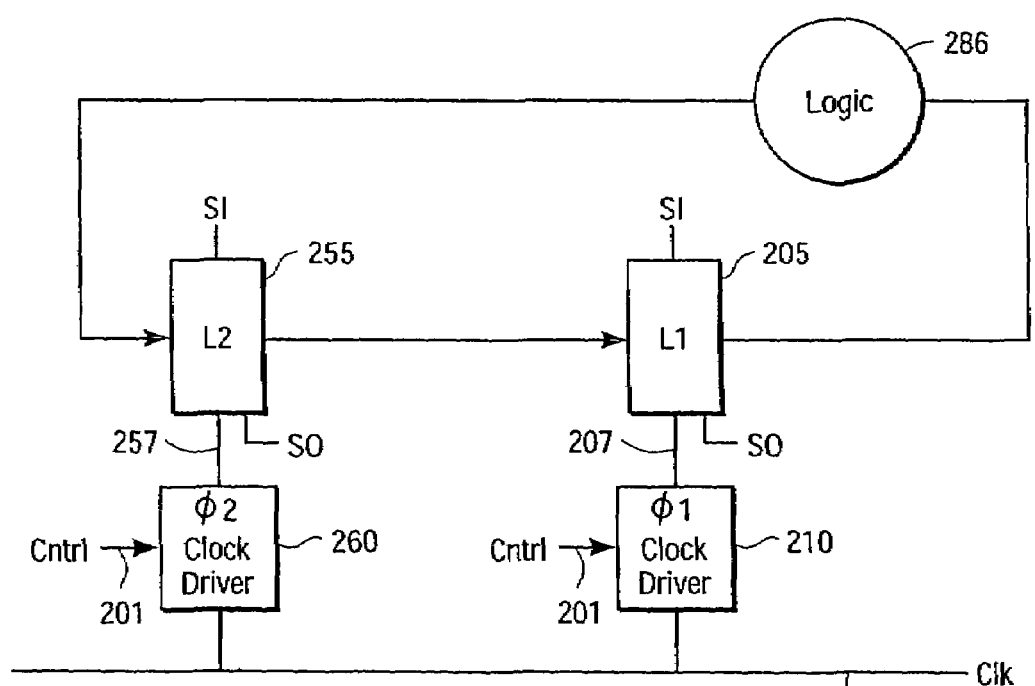
FIG. 2B is a block diagram of a latch timing circuit in accord with the present invention.

The present invention generally comprises a multi-mode latch timing circuit and method that permits a single latch timing circuit to be used in an least two different modes of operation. FIGS. 2A–2C are block diagrams showing latch timing circuits in accord with one embodiment of the present invention. FIG. 2D is a flow chart showing illustrative modes of operation. One mode of operation 292 is as a conventional two-phase latch timing circuit having two non-overlapping latch states of a first and a second set of latches. Another mode of operation 294 holds the first set of latches in a transparent state to reduce clock power consumption. Additionally, in one embodiment, in a third mode of operation 296 the two phase clocking signals may be altered from a conventional overlap mode to an underlap mode, which is beneficial to debug race conditions.

Referring to FIG. 2A, a first set of latches 205 (e.g., at least one "L1" latch") is part of a data path with a second set of latches 255 (e.g., at least one "L2" latch). The first set of latches 205 is coupled to the output of a first local clock driver 210 (a first phase driver, sometimes known as a "ph1" or "Φ1" clock driver) for supplying a voltage to the latch input control 207 of latches 205. The second set of latches 255 is coupled to the output of a second local clock driver 260 (a second phase driver, sometimes known as a "ph2" or "Φ2" clock driver) for supplying a voltage to the latch input control 257 of latches 255.

The latch timing circuit of the present invention may be applied to a variety of logical path designs for controlling the flow of data to logical units, including long paths, short paths, and combinations thereof. As indicated in FIG. 2A, the latches may be arranged as part of a long path, i.e., a logical data path having a cycle time of at least half of the clock period. A logic unit 282 may be coupled between the second and first set of latches. Alternately, as indicated in FIG. 2B, the latches may be arranged as part of a short path, i.e., a logical data path for a logical data unit having a cycle time less than half the clock period. A logic unit 286 may be coupled between the first set of latches and the second set of latches. Additionally, as indicated in FIG. 2C, the latches may be arranged to be part of both a long path and a short path. For example, there may be a first logic unit 287 coupled between the second and first set of latches and a second logic unit 289 coupled between the second and first set of latches.

In accord with the present invention, each local clock driver 210 and 260 receives a master clock signal (CLK) from a clock input 202. In one embodiment, the local clock drivers 210 and 260 are configured to permit at least two different modes of operation. As described below in more detail, one mode of operation is as a conventional two-phase non-overlapping latch timing circuit in which the first clock driver generates a ph1 clock signal and the second clock driver generates a ph2 clock signal. Additionally, in one embodiment the local clock driver 210 of one or more logical paths enters a cold clocking mode in a second mode of operation. In the cold clocking mode of operation, the L1 latches are transparent, thereby reducing clock power consumption in all logical paths in which the first clock driver 210 is cold clocked.

Referring again to FIGS. 2A–2C, in a first mode of operation first clock driver 210 generates a clock signal having a first clock phase (ph1) and second clock driver 260 generates a clock signal having a second clock phase (ph2), with the first and second clock phases selected to be non-overlapping clock phases, i.e., clock phases that open and close L1 latches 205 and L2 latches 255 in a non-overlapping sequence in each clock cycle.

Figure 3:
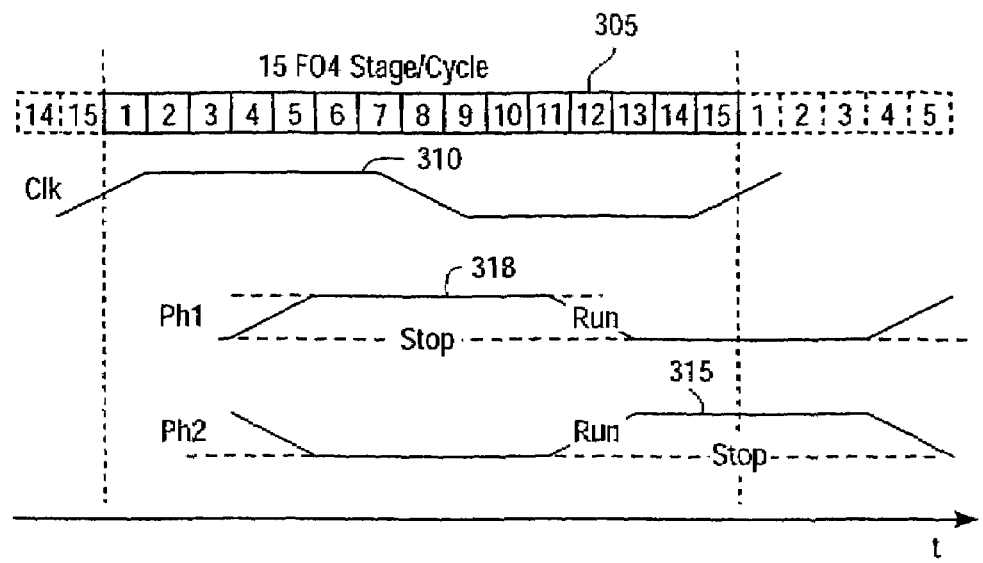
FIG. 3 shows illustrative signals of the first and second clock drivers in a first mode of operation.

FIG. 3 shows exemplary waveforms in a first mode of operation for both long and short paths for a 15 FO4 stage/cycle logic path operating as a non-overlapping two-phase latch timing circuit. Illustrative stages 305 are shown. A master clock signal 310 is received by the first clock driver 210 and by the second clock driver 260. As shown in FIG. 3, during the first mode of operation the first clock driver 210 generates the ph1 clock signal 318 and the second clock driver generates the ph2 clock signal 315. In one embodiment the ph1 and ph2 clock signals have complementary clock phases that cross over at a voltage of Vdd/2, where Vdd is the maximum clock voltage.

In a second mode of operation, the first clock driver 210 generates a bias voltage 312 sufficient to maintain the first set of latches in a transparent state. In this cold-clocking mode of operation, the second set of latches has characteristics similar to a single set of edge clocked latches, reducing the clock power consumption. In one embodiment, the first clock driver 210 includes at least one control input port 201 for inputting a control signal (CNTRL) to change the mode of operation of first clock driver 210. Additionally, in one embodiment, the second clock driver 260 includes at least one control input port 201 for inputting a control signal (CNTRL) to adjust the width of clock pulses generated by the second clock driver 260 in a second mode of operation.

Figure 4:
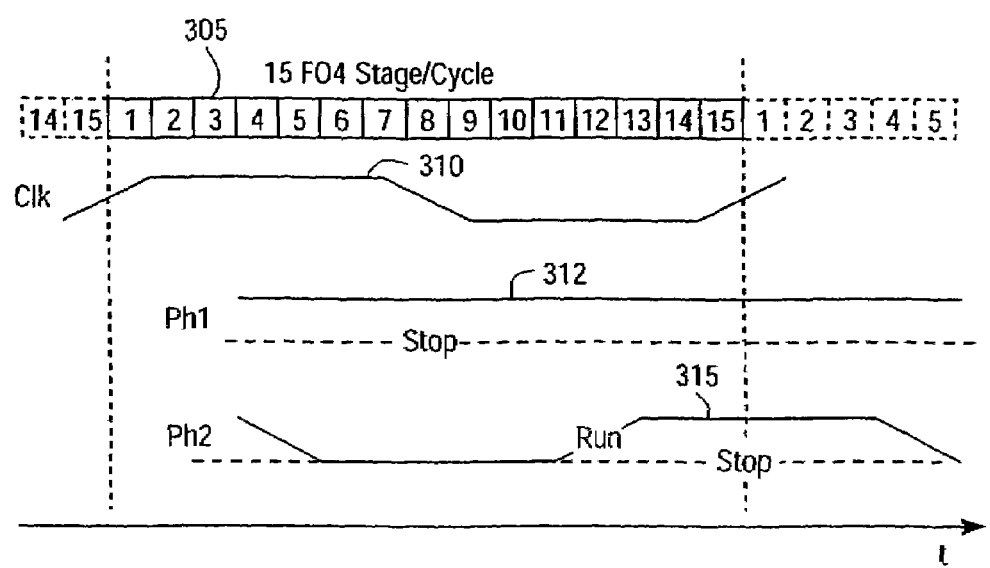
FIG. 4 shows illustrative signals of the first and second clock drivers in the long path for a cold clock mode of operation.

FIG. 4 shows exemplary waveforms for a long path in a second (cold clock) mode of operation for long paths. The first clock driver 210 generates a bias voltage 312 sufficient to render its corresponding first set of latches transparent. For latches that are in a long path, the second clock driver 250 may continue to generate conventional ph2 clock signals having a duty cycle of approximately 50%.

Figure 5:
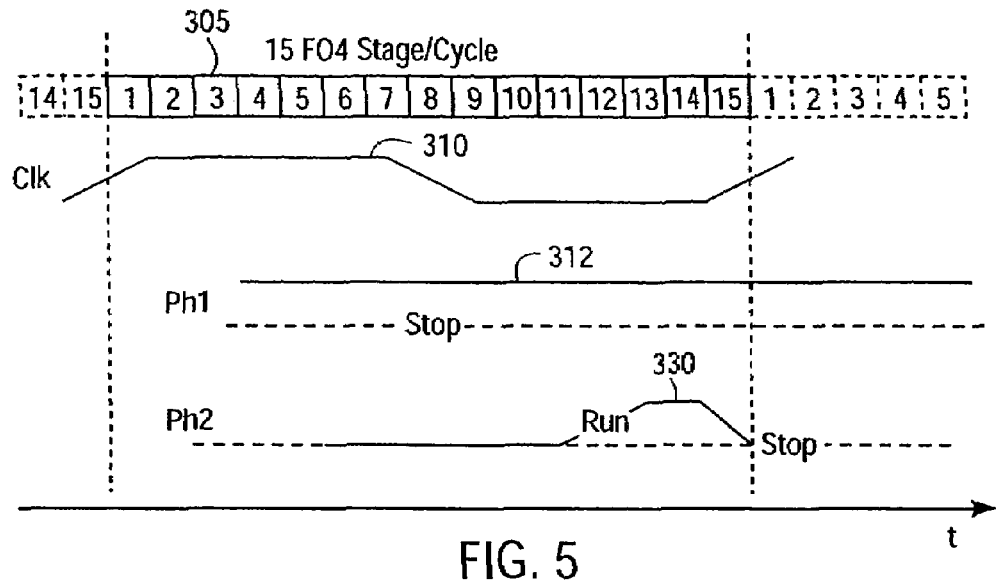
FIG. 5 shows illustrative signals of the first and second clock drivers in the short path for a cold clock mode of operation.

The first set of latches in short paths may also be cold clocked if the pulse width of ph2 clock signals is reduced to avoid fast paths. FIG. 5 shows exemplary waveforms for short paths in the second mode of operation. In the second mode of operation the first clock driver 210 generates a bias voltage 312 sufficient to render its corresponding latches transparent. However, for short paths the second clock driver 250 generates pulses 330 triggered at an appropriate phase of the master clock (e.g., on the falling edge of the master clock) and having a sufficiently reduced width (e.g., about 20% of the clock period) to prevent a race condition in the short path.

In one embodiment, in the first mode of operation in the short paths the clock drivers overlap the ph1 and ph2 clock signals, with the ph1 and ph2 edges crossing at Vdd/2. The degree of overlap in any instance is determined by the amount of local clock skew. Slight, permanent clock underlap can be implemented by using skewed stages. This reduces the occurrence of fast path race conditions. However, it may be insufficient to guarantee no race conditions in short paths if there is significant local clock skew. In the second mode of operation the ph2 clock signal comprises pulses 330 having a short pulse width to prevent a race condition.

It will be understood that the second (cold clock) mode of operation is optional and may depend upon whether the logic circuit is designed and fabricated to have timing delays within preselected tolerances. In a properly designed and manufactured machine the timing delays permit cold clocking in the long paths because: 1) long path ph1 latches may be designed to be transparent before the evaluate wave arrives; 2) long path ph1 latches may be designed to close after the evaluate wave (corresponding to the propagation of a new machine state through logic and wires) has passed; and 3) long paths are over ½ cycle, so the ph2 state of the second set of latches can't race back to the ph2 logic while the ph2 latch is still transparent. As previously, described, cold clocking may be possible in short paths if the pulse width of edge-triggered pulses in the second set of latches is triggered at the appropriate portion of the master clock phase and with a sufficiently reduced pulse width (underlap) to prevent a race condition. However, it is possible that design errors or manufacturing variances may lead to timing errors that prohibit the use of cold clocking in long paths and/or short paths.

Consequently, in one embodiment, long path and short path logic circuits are tested in the conventional two-phase non-overlapping first mode of operation. The logic circuit is tested again in the cold clocking mode. In one embodiment, if the logic circuit functions suitably in the cold clock mode, a programmable element is used to program the local clock drivers to remain in the cold clock mode. The programmable element may, for example, be a programmable fuse.

Figure 6:
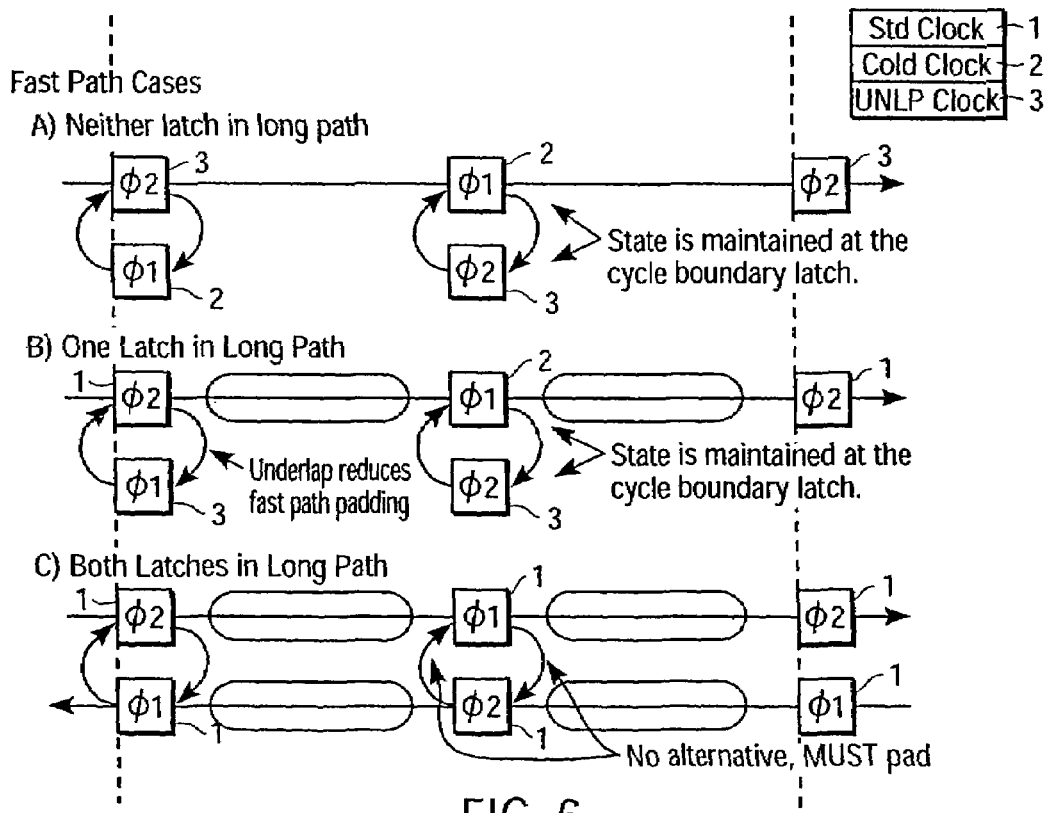
FIG. 6 shows illustrative latch paths for fast path cases.

It may be possible to organize a machine so that most latches have either long cones or short cones. In this case cold clock can always be used. Up to 50% of the clock power could be eliminated or up to 20% of the total machine power. Use of cold clock and non-overlap clock design depends on the paths in which the latches are embedded. Example applications are illustrated in FIG. 6. Fast path cases with latches operated with a standard clock 1, a cold clock 2, or an underlapped clock 3 are shown for illustrative sequences of Φ1 and Φ2 latches. Note that a latch can be in both short and long paths simply because its logic cone has short and long paths.

It will be understood that the timing margin of a logic circuit is preferably selected to facilitate cold clocking. For best performance and speed of design, latches are preferably placed in the time domain far away from clock edges. This design method leaves a timing margin between when the latch is intended to pass data and when it must pass data. Margin checking is preferably performed by a timing analysis tool. The smallest margins are typically of the most concern. The timing tool preferably permits the user to specify margin requirements for certain signals. Violations of margin requirements are to be reported as timing errors. Timing margin is not slack. It is a cushion between how a design was intended to be versus what actually happens. The margin design preferably requires the fewest changes to logical latch location as the design progresses. For example, FETs and wires have non-defect manufacturing variations that alter delay. Margin design automatically amortizes these variations over multiple stages and latch boundaries. The opportunistic time borrowing permits a process speed gain anywhere in a path to help the whole path.

Figure 7:
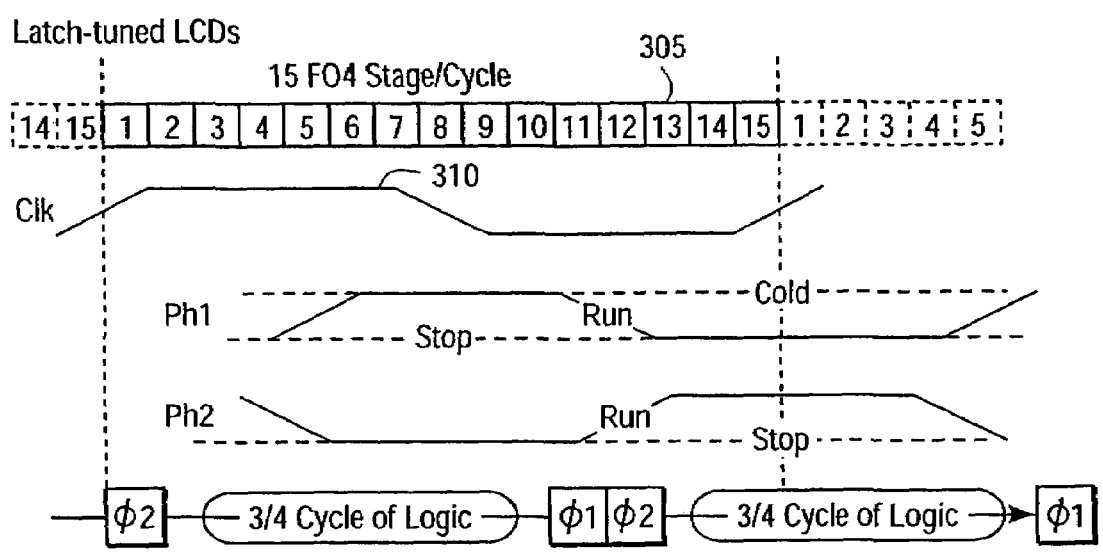
FIG. 7 illustrates one embodiment of a logical path design for using flip flops

Logic cone width and SRAM access time may require a compromise with margin design ideals. The compromise, however, can be deliberately planned and the remaining tolerance monitored by timing. Power and area for fast path padding can be reduced with non-overlapping local clock drivers (LCDs) as illustrated in FIG. 7. Such LCDs, however put flip-flop design at a further disadvantage since 'efficient' flip flop design prefers overlapped clocks. When flip-flops do occur in the design, logic delay between them and latches should be allocated as in FIG. 7. Flips flops are pinned down in the time domain to the moment of the clock transition. In one embodiment, nominally ¾ cycle of logic resides between a flip-flop and a latch to maintain the timing design margin.

While FIGS. 3–5 illustrate a method of using cold clocking and underlapping to reduce clock power, these techniques may be adapted for other purposes as well. In one embodiment, the first and second clock drivers are both configured to generate underlapped pulses responsive to an underlap signal to both clock drivers. The first clock driver may, for example, generate pulses responsive to the rising edge of the clock signal whereas the second clock driver may generate pulse responsive to a falling clock signal. The underlapping may, for example, be used to compensate for design or manufacturing errors that would otherwise result in a race condition. This third mode of operation is useful, for example, to debug race conditions.

Additionally, it is desirable in some applications to have the capability to cold-clock both the first and second clock drivers during testing. Consequently, in one embodiment both the first and second clock drivers have a mode of operation in which they generate a bias voltage sufficient to drive their respective latches into transparency.

The first and second clock drivers may be implemented using a logic circuit to control the input to a buffer. In one embodiment, the first clock driver comprises a logic circuit coupled to the input of a buffer circuit (e.g., an inverter or a chain of inverters). In one embodiment, the logic circuit is configured so that the input of the buffer is a bias voltage driving the output of the buffer high if the cold clock signal (COLD) is high and the input of the buffer is a time varying clock signal with an appropriate phase delay if the cold clock signal is low.

In another embodiment, the logic circuit includes a pulse generator configured so that the input of the buffer receives clock-triggered pulses having a reduced pulse width with respect to the master clock in a pulse generator mode.

Figure 8A:
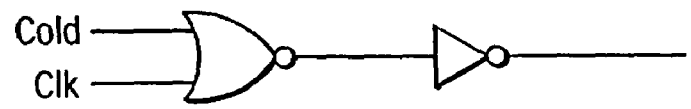
FIGS. 8A–8C are circuit diagrams of one embodiment of the first clock driver.
Figure 8B:
Figure 8C:
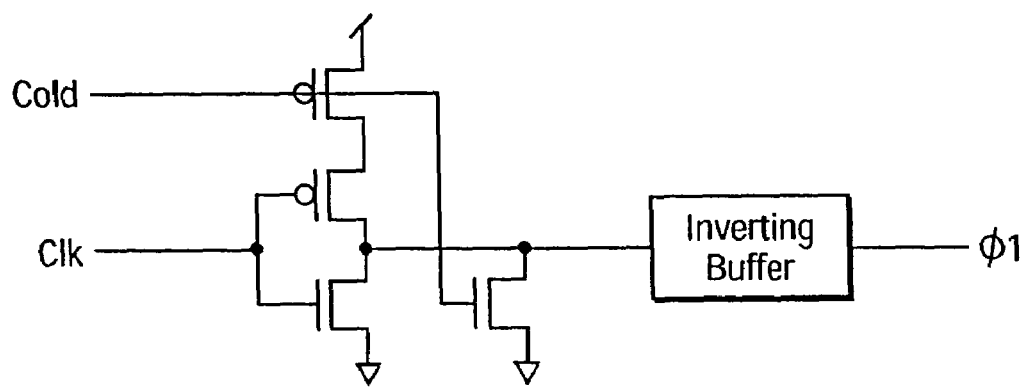

FIGS. 8A–8C shows an exemplary cold clocking circuit for the first clock driver. As shown in FIG. 8A, in one embodiment, an inverter is coupled to the output of a NOR gate having a first input that is a master clock signal (CLK) and a second signal that is a COLD signal. As shown in FIG. 8B, the logical equivalent of the circuit of FIG. 8A is an OR gate. As a result the output of the circuit will be a logical high signal if the COLD signal is high. If the COLD signal is low, the output of the circuit is the clock signal. FIG. 8C shows a transistor-level implementation.

Figure 9A:
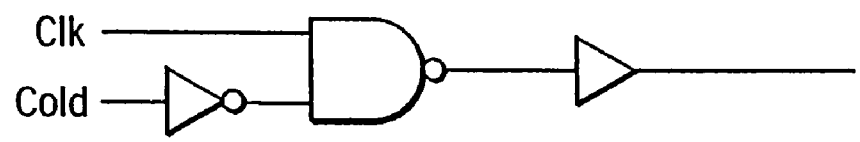
FIGS. 9A–9C are circuit diagrams of one embodiment of the second clock driver.
Figure 9B:
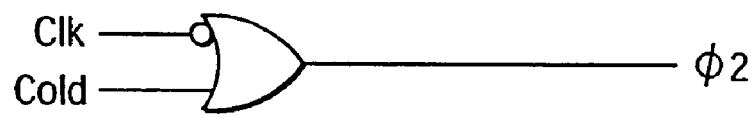
Figure 9C:
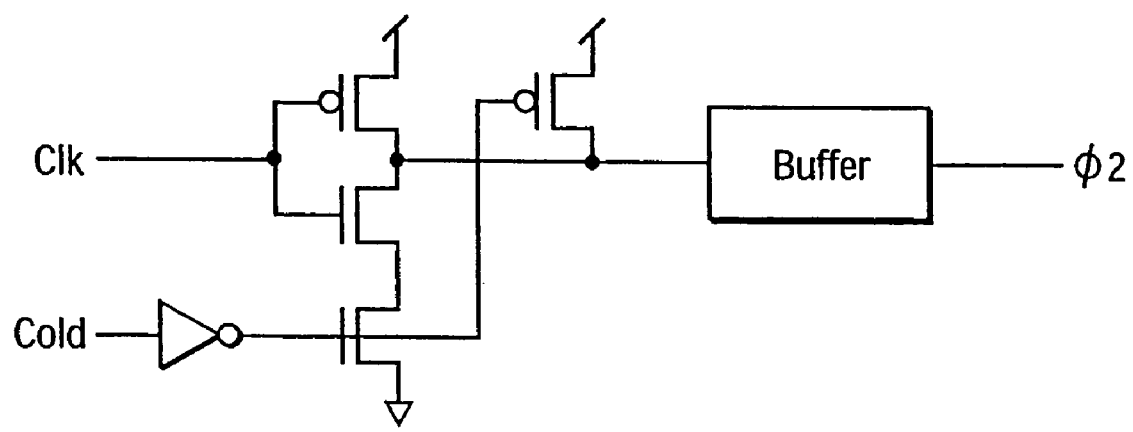

In one embodiment, the second clock drivers may be cold-clocked during testing. As shown in FIG. 9A, in one embodiment, NAND gate drives a buffer. One input of the NAND gate is the clock signal. The other input of the NAND gate is the complement of a COLD signal. The logical equivalent of this circuit is shown in FIG. 9B. FIG. 9C shows a transistor-level implementation. If the COLD signal is a logical high, the output of the circuit is high. If the cold signal is low then the output is the complement of the clock signal.

Figure 10A:
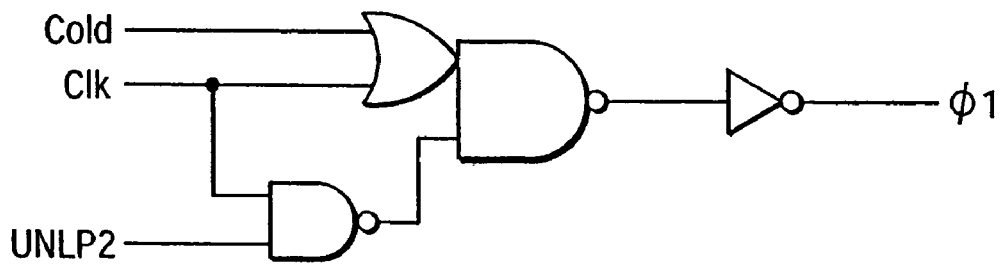
FIGS. 10A–10E are circuit diagrams of a second embodiment of the first clock driver.
Figure 10B:
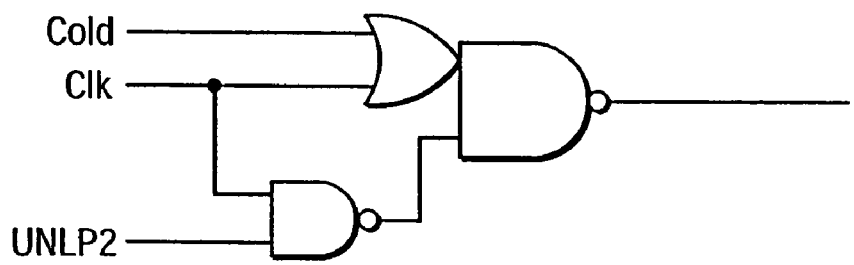
Figure 10C:
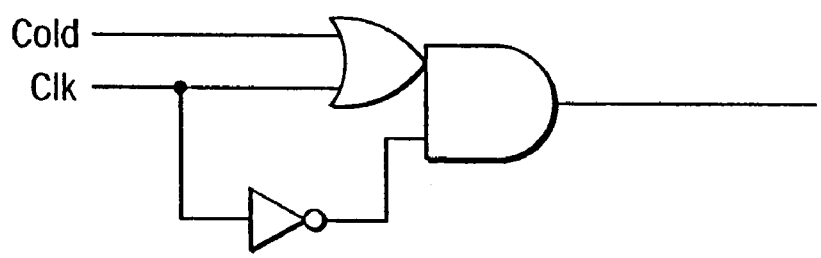
Figure 10D:
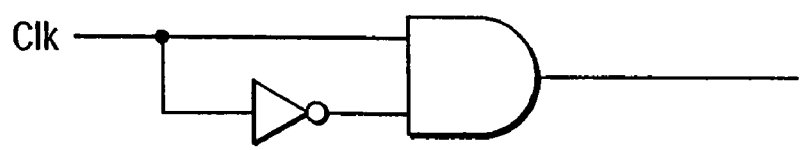
Figure 10E:
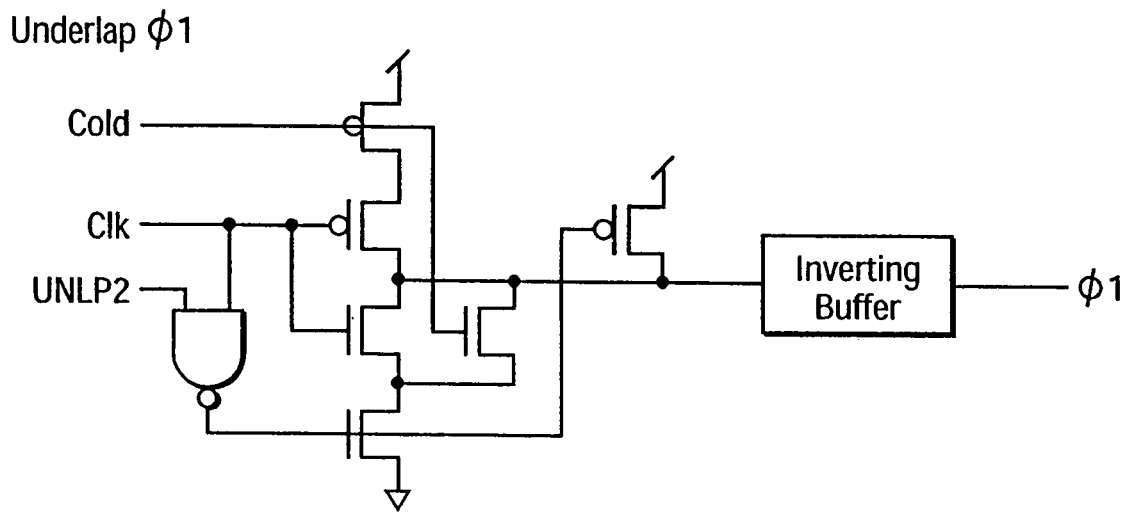

FIGS. 10A–10E show an embodiment of a first clock driver that has a conventional mode, an underlapped clock mode, and a cold clock mode. As indicated in FIG. 10A, the output of a NAND gate is coupled to an inverter. One input to the NAND gate is an OR gate having as one input a COLD signal and the clock signal as the other input. The other input to the NAND gate is a second NAND gate having as one input the clock signal and as the other input an underlap control signal (UNLP2). FIG. 10B shows a logical equivalent of the circuit of FIG. 10A. When the underlap control signal has a value of zero, the second NAND gate has an output of one, such that the circuit is equivalent to an OR gate having as a first input the clock signal and a second input that is the cold signal. Consequently, if the underlap control signal is low and the cold signal is low, the output is the clock signal. However, if the underlap signal is low and the cold signal is high, the output will stay high. FIG. 10C shows an equivalent logical circuit if the underlap signal is high and FIG. 10D shows an equivalent circuit for the underlap signal being high and the cold signal being low. For this case, the circuit functions as a pulse generator that generates a pulse on the rising edge of a pulse. FIG. 10E is a circuit diagram showing a transistor level implementation.

Figure 11A:
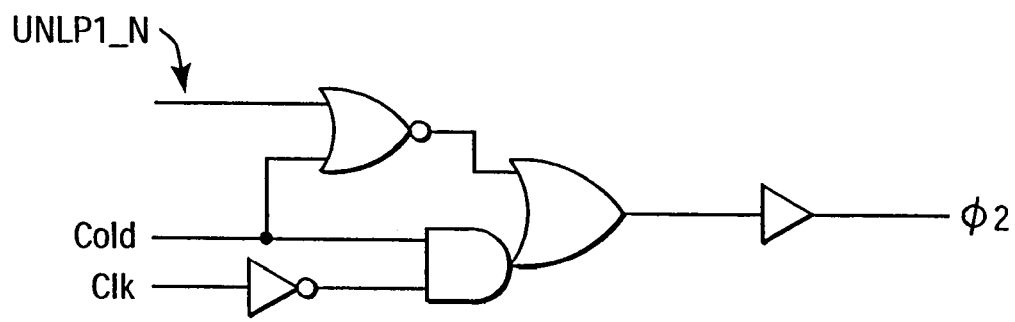
FIGS. 11A–11B are circuit diagrams of a second embodiment of the second clock driver.
Figure 11B:
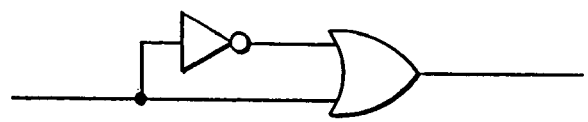

FIG. 11A shows a logical circuit for a second pulse generator having a clock, cold, and an underlap control signal (UNLP_n). FIG. 11B shows a logical equivalent circuit in the pulse mode.

Figure 12:
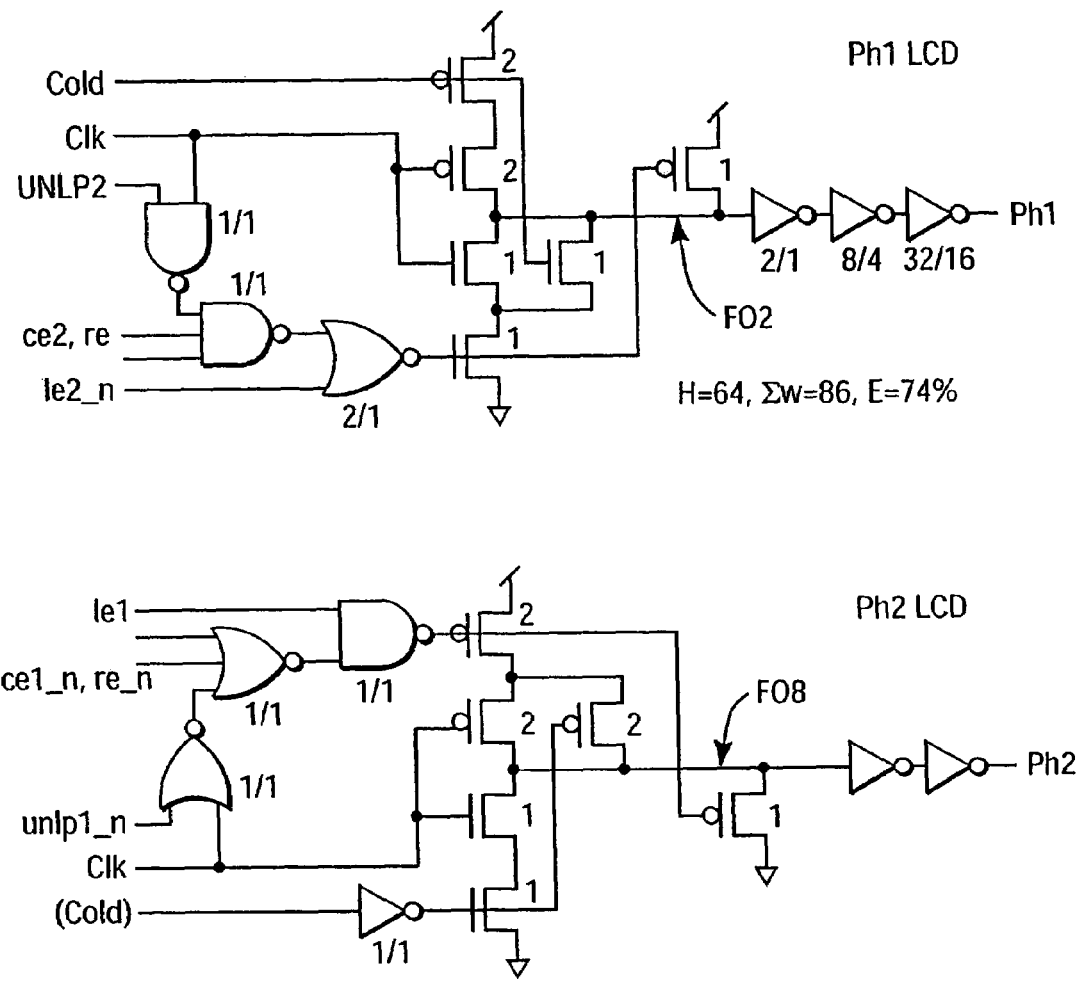
FIGS. 12 and 13 show detailed circuit diagrams of several embodiments of the first and second clock drivers.
Figure 13:
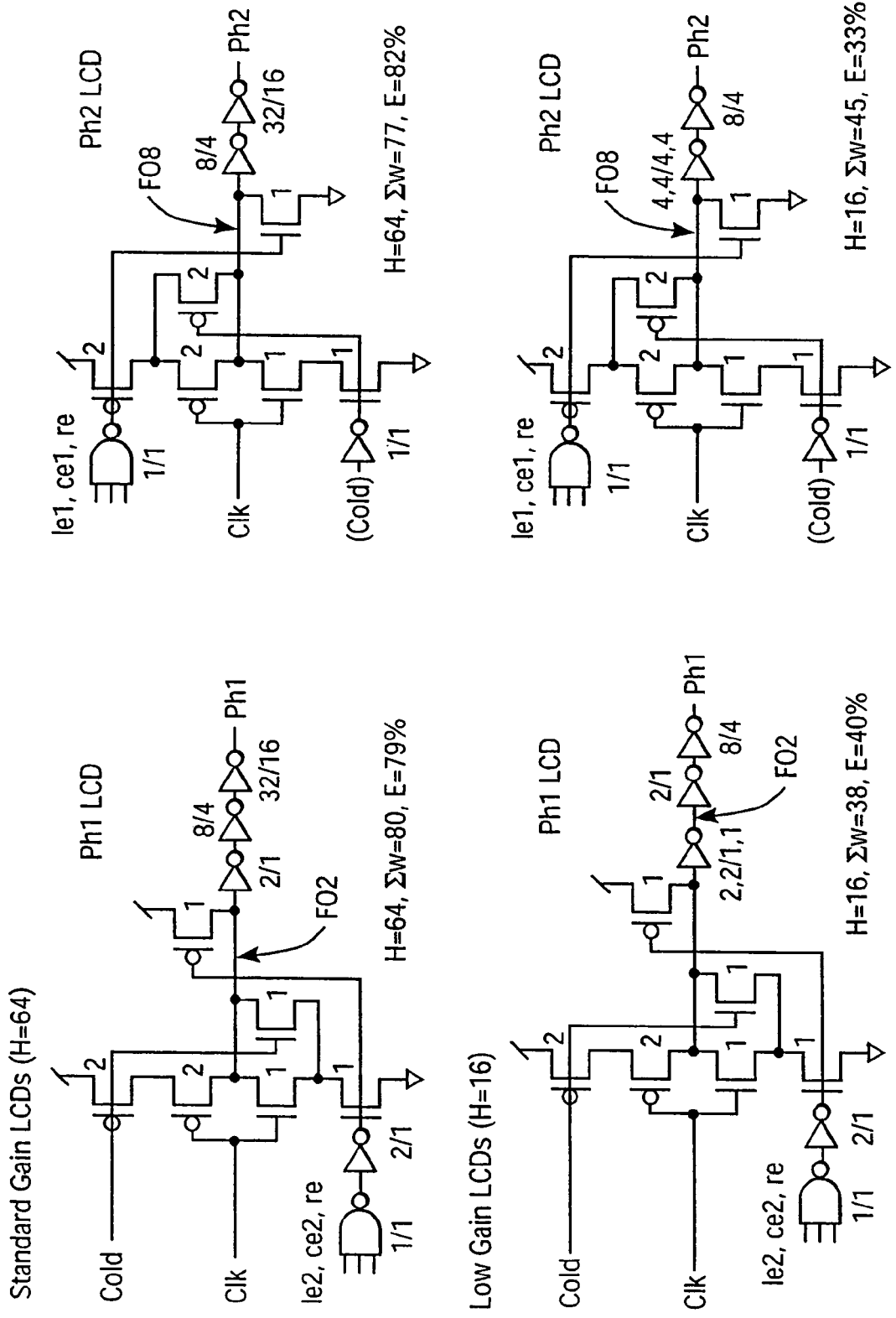

FIGS. 12–13 show additional embodiments of the first and second clock drivers with additional control gates arranged to receive control signals le1, ce1, and re, which are various clock inhibit signals. When all 'unlp' signals are inactive, ph1 and ph2 overlap in the normal fashion. When 'unlp' is active, a given clock driver becomes a pulse generator that fires at the start of its phase. The inherent delay of the existing enable logic chain sets the pulse width at about 3 FO4. Since the pulse width is narrow and the transparent latch based designed permits cycle stealing, the clock rate must be slowed to half speed to ensure all data is available during non-overlap mode.

Figure 14:
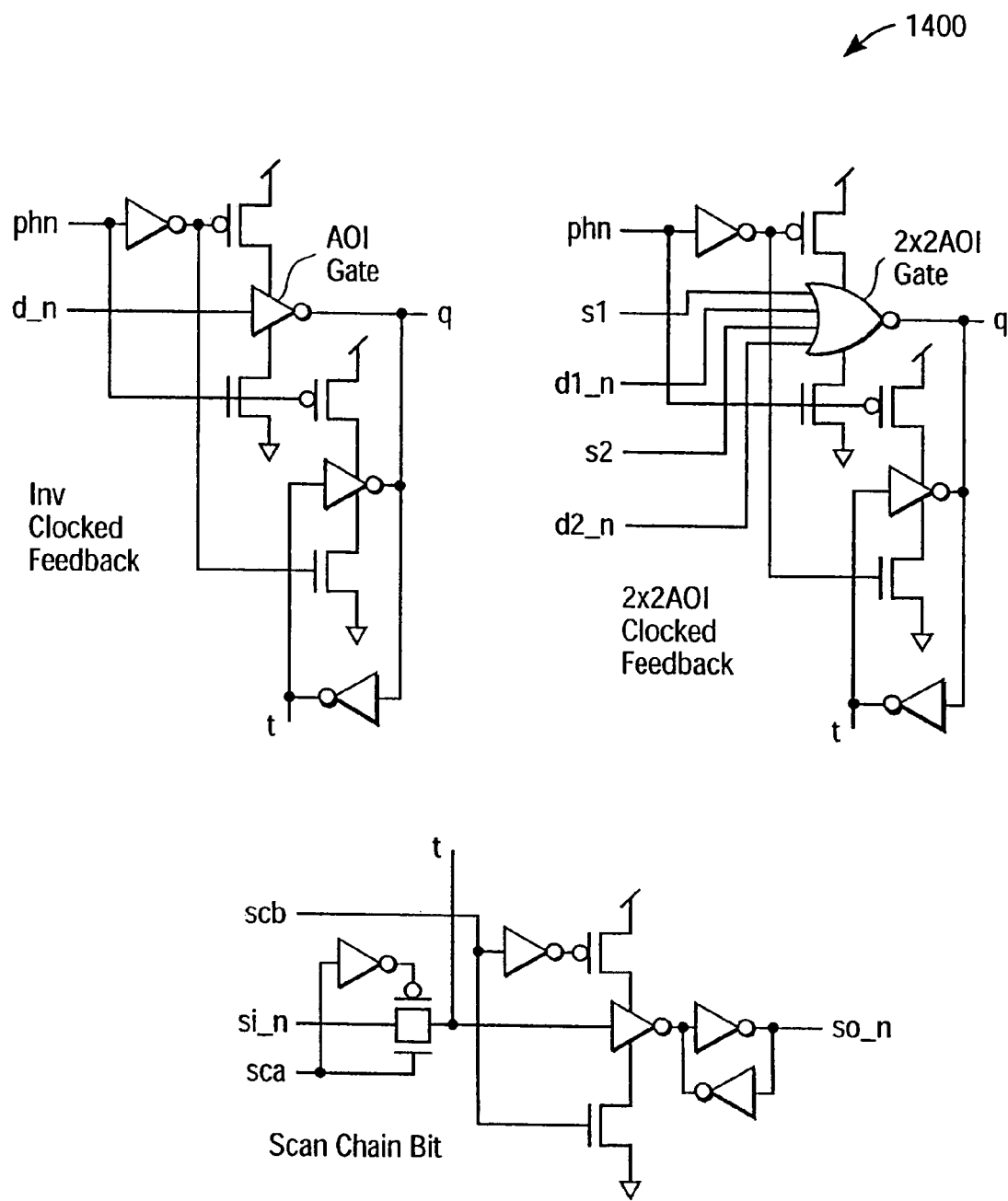
FIGS. 14 and 15 show circuit diagrams of exemplary latches for use with the latch timing circuit of FIGS. 2A–2C.
Figure 15:
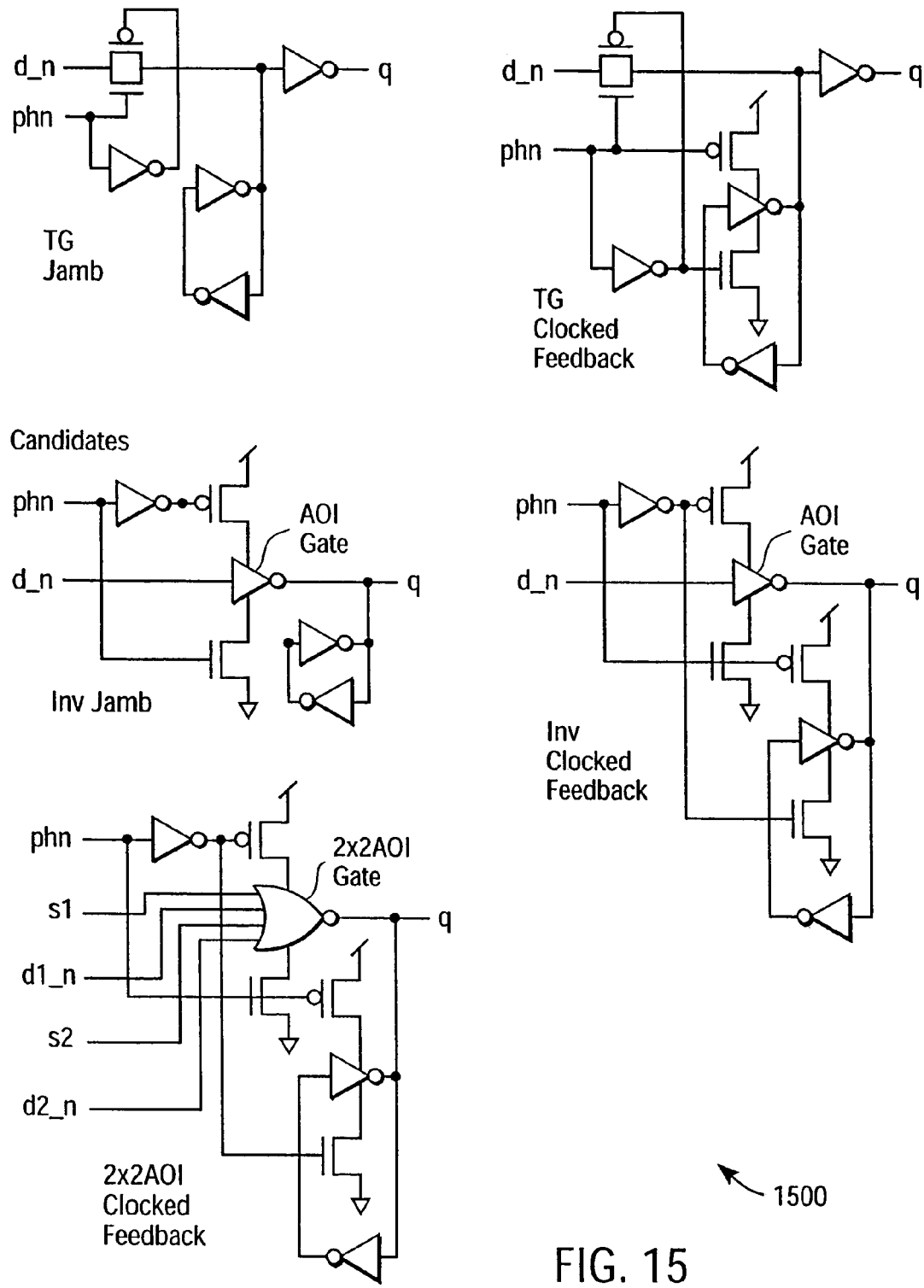

It will be understood that the first and second set of latches may comprise a variety of different latch designs, such as latches with scan chain bits. FIG. 14 shows circuit schematics 1400 of exemplary latches and their scan bits. FIG. 15 shows a second set of exemplary latch designs 1500.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A method of operating a logic circuit having first and second sets of latches in a logical path of an integrated circuit comprising:
   in a two-phase transparent latch mode, driving the first set of latches wit a first clock signal having a first phase and driving the second set of latches with a second clock signal having a second phase, the first and second phases selected so that the first and second sets of latches are non-overlapping;
   in a single phase pulse latch mode, rendering the first set of latches transparent with a bias voltage and driving the second set of latches with the second clock signal;
   in a test mode, evaluating operation of the logic circuit in the two-phase transparent latch mode; and programming the logic circuit to operate in the single phase latch mode in a normal operational mode.

2. The method of claim 1, further comprising:
   in the single-phase latch mode, reducing the pulse width of each pulse of the second clock signal to prevent a race condition in at least one short path.

3. The method of claim 1, further comprising:
   in a test mode, evaluating operation of the logic circuit in the two-phase transparent latch mode.

4. The method of claim 1, further comprising:
   in a test mode, evaluating operation of the logic circuit in the two-phase transparent latch mode and in the single phase latch mode; and
   responsive to the logic circuit operating satisfactorily in the single phase latch mode, programming the logic circuit to operate in the single phase latch mode in a normal operational mode; and
   responsive to the logic circuit operating unsatisfactorily in the single phase latch mode, programming the logic circuit to operate in the two-phase transparent latch mode in a normal operational mode.

5. The method of claim 4, further comprising:
   selecting the pulse width in the single-phase latch mode to prevent a race condition in a short path.

6. A method of reducing the clock power required by a logic circuit having first and second sets of latches in a logical path of an integrated circuit, comprising:
   in a test mode requiring two phase non-overlapping latch operation of the logical path, driving the first set of latches with a first clock signal having a first phase and driving the second set of latches with a second clock signal having a second phase; and
   in an operational mode requiring cycling of only the second set of latches, driving the first set of latches with a bias voltage selected to render the first set of latches transparent and driving the second set of latches with the second clock signal.

7. The method of claim 6, further comprising:
   in the operational mode, reducing clock pulse width of the second clock signal to prevent a race condition in a short path.

8. A logic circuit having first and second sets of latches in a logical path of an integrated circuit, comprising:
   a first driver to drive the first set of latches with a first clock signal, the first clock signal having a first phase in a two-phase transparent latch mode, and the first clock signal rendering the first set of latches transparent with a bias voltage in a single-phase pulse latch mode;
   a second driver to drive the second set of latches with a second clock signal, the second clock signal having a second phase such that the first and second phases are non-overlapping in the two-phase transparent latch mode; and a programmable element to program the first driver to the single-phase pulse latch mode in a normal operational mode responsive to the logic circuit operating satisfactorily in the single-phase latch mode, and to program the second driver to the two-phase transparent latch mode in a test mode responsive to the logic circuit operating unsatisfactorily in the single-phase latch mode.

9. The circuit of claim 8, further comprising a pulse generator to generate a pulse responsive to the second clock signal, the pulse having a pulse width of shorter duration than the second clock signal to prevent a race condition in at least one short path in the single-phase latch mode.

10. The circuit of claim 8, wherein the first and second clock signals are derived from a master clock signal input to the first and second drivers.

11. The circuit of claim 8, further comprising a programmable element to program the first driver to the single-phase pulse latch mode.

12. The circuit of claim 11, wherein the programmable element comprises a programmable fuse.

* * * * *

UNITED STATES PATENT AND TRADEMARK OFFICE
CERTIFICATE OF CORRECTION

PATENT NO.         : 7,051,294 B2
APPLICATION NO. : 10/703295
DATED              : May 23, 2006
INVENTOR(S)        : Robert P. Masleid It is certified that error appears in the above-identified patent and that said Letters Patent is hereby corrected as shown below:

Column 7, Line 33

Please delete "wit" and insert --with--.

Signed and Sealed this

Fifteenth Day of August, 2006

JON W. DUDAS
*Director of the United States Patent and Trademark Office*